(12) United States Patent
Wyse et al.

(10) Patent No.: US 8,937,495 B1
(45) Date of Patent: Jan. 20, 2015

(54) FREQUENCY ENHANCED EMITTER COUPLED LOGIC TOPOLOGY

(71) Applicants: Russell D. Wyse, Center Point, IA (US); Mark A. Willi, Marion, IA (US); Michael L. Hageman, Mount Vernon, IA (US)

(72) Inventors: Russell D. Wyse, Center Point, IA (US); Mark A. Willi, Marion, IA (US); Michael L. Hageman, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 117 days.

(21) Appl. No.: 13/852,775

(22) Filed: Mar. 28, 2013

(51) Int. Cl.
*H03K 19/086* (2006.01)
*H03K 19/00* (2006.01)

(52) U.S. Cl.
CPC .................................. *H03K 19/0013* (2013.01)
USPC ............................ 326/126; 326/124; 326/127

(58) Field of Classification Search
USPC .......................................... 326/124, 126, 127
See application file for complete search history.

(56) References Cited

U.S. PATENT DOCUMENTS 4,308,469 A * 12/1981 Cavaliere et al. ............. 326/127
4,890,067 A * 12/1989 Lamb ............................. 330/149
5,399,988 A * 3/1995 Knierim ......................... 330/149
6,778,569 B2 * 8/2004 Fischer ........................ 372/38.02
2007/0182491 A1 * 8/2007 Iikura ............................. 330/311

OTHER PUBLICATIONS

Wikipedia, Emitter-Coupled Logic, en.wikipedia.org/w/index.php?title=Emitter-coupled_logic&printable=yes, retrieved on Feb. 26, 2013, 6 pages.

* cited by examiner

*Primary Examiner* — Don Le
(74) *Attorney, Agent, or Firm* — Angel N. Gerdzhikov; Donna P. Suchy; Daniel M. Barbieri

(57) ABSTRACT

Emitter-coupled logic circuits and systems that include such circuits are provided. Some emitter-coupled logic circuits include a plurality of fT-doubler circuits. Each fT-doubler circuit includes a plurality of transistors coupled to one another in an arrangement such that the plurality of transistors are configured to behave as a single enhanced transistor that has an effective unity current gain frequency that is higher than if a single transistor were used in its place. The fT-doubler circuits are configured to increase an operating frequency capability of the emitter-coupled logic circuit. Some emitter-coupled logic circuits include a plurality of cascode amplifier circuits. Each cascode amplifier circuit includes multiple transistors. An emitter of at least one first transistor of the plurality of transistors is coupled to a collector of at least one second transistor of the plurality of transistors Some emitter-coupled logic circuits may include both fT-doubler circuits and cascode amplifier circuits.

20 Claims, 12 Drawing Sheets

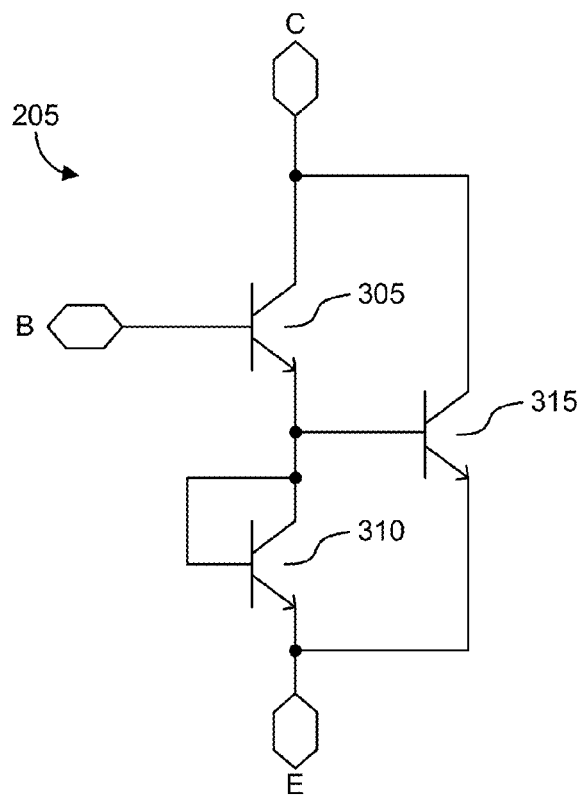
FIG. 3
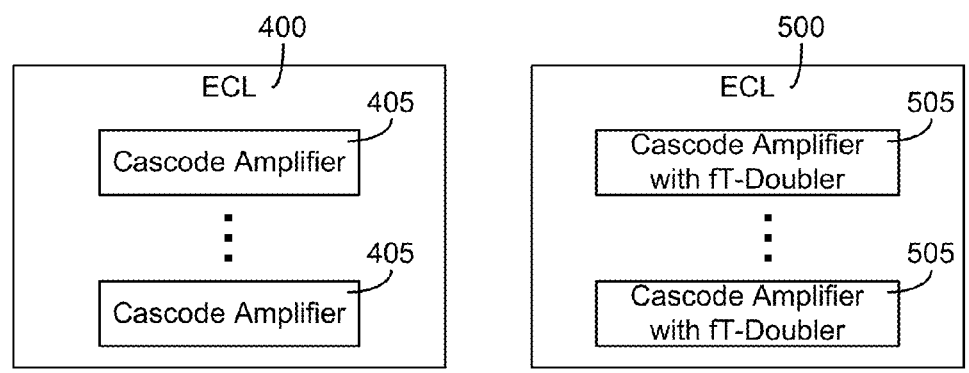
FIG. 4
FIG. 5

FREQUENCY ENHANCED EMITTER COUPLED LOGIC TOPOLOGY

BACKGROUND

The present disclosure relates generally to the field of electrical logic circuits. More particularly, the present disclosure relates to emitter-coupled logic circuits having a circuit topology that allows the logic circuits to perform functions at a high frequency.

High frequency logic cells may be used in various applications that require high levels of system performance and enhanced capabilities. However, conventional high speed logic cells may not be capable of supporting high enough operating frequencies for certain applications. Additionally, such conventional logic cells may consume a large amount of DC power and may not be capable of being used with certain types of highly integratable transistor processes (SiGe BiCMOS for example offers highly integratable circuit densities on the same wafer, which may allow for RF, analog, mixed signal, digital logic, DSP functions, memory, processors, etc. circuits all on one wafer). Thus, there is a need for a logic circuit that can be used at very high operating frequencies, consumes a low amount of DC power, and/or is capable of implementation with transistor fabrication technologies that offer high levels of integration capability.

SUMMARY

One embodiment of the disclosure relates to an emitter-coupled logic circuit that includes a plurality of fT-doubler circuits. Each fT-doubler circuit includes a plurality of transistors coupled to one another in an arrangement such that the plurality of transistors are configured to behave as a single enhanced transistor that has an effective unity current gain frequency that is higher than if a single transistor were used in its place. The plurality of fT-doubler circuits are configured to increase an operating frequency capability of the emitter-coupled logic circuit as compared to using single transistors in place of the fT-doubler circuits.

Another embodiment relates to an emitter-coupled logic circuit that includes a plurality of cascode amplifier circuits. Each cascode amplifier circuit includes a plurality of transistors. An emitter of at least one first transistor of the plurality of transistors is coupled to a collector of at least one second transistor of the plurality of transistors.

Another embodiment relates to a system that includes a plurality of emitter-coupled logic circuits. Each emitter-coupled logic circuit includes a plurality of cascode amplifier circuits. Each cascode amplifier circuit includes a plurality of transistors. An emitter of at least one first transistor of the plurality of transistors is coupled to a collector of at least one second transistor of the plurality of transistors. Each of the plurality of cascode amplifier circuits comprises at least one fT-doubler circuit. Each fT-doubler circuit comprises a plurality of transistors coupled to one another in an arrangement such that the plurality of transistors are configured to behave as a single enhanced transistor that has an effective unity current gain frequency that is higher than if a single transistor were used in its place. The fT-doubler circuits are configured to increase an operating frequency capability of the emitter-coupled logic circuit as compared to using single transistors in place of the fT-doubler circuits.

BRIEF DESCRIPTION OF THE DRAWINGS

The disclosure will become more fully understood from the following detailed description, taken in conjunction with the accompanying figures, wherein like reference numerals refer to like elements, in which:

FIG. 3 is a circuit diagram of a fT-doubler circuit according to an exemplary embodiment;

FIG. 4 is a block diagram of an emitter-coupled logic circuit according to another exemplary embodiment;

FIG. 5 is a block diagram of an emitter-coupled logic circuit according to yet another exemplary embodiment;

DETAILED DESCRIPTION

Before turning to the figures, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, emitter-coupled logic ("ECL") circuits and systems that utilize such circuits are shown and described according to various exemplary embodiments. The ECL circuits include any type of logic circuit (e.g., buffer circuit, AND gate, OR gate, NOT gate, NAND gate, NOR gate, XOR gate, XNOR gate, etc.). In some embodiments, the ECL circuits may include one or more fT-doubler circuits configured to improve the frequency response capabilities of the ECL circuits. The fT-doubler circuits may include two or more transistors (e.g., three transistors) coupled to one another in a configuration such that they behave as a single enhanced transistor with an effective unity current gain frequency that is higher than if a single transistor were used in its place. In some embodiments, the fT-doubler circuit may approximately double the effective unity current gain frequency as compared to using single transistors.

In some embodiments, the ECL circuits may additionally or alternatively include one or more cascode amplifier circuits. Each cascode amplifier may include multiple transistors. An emitter of at least one first transistor may be coupled to a collector of at least one second transistor in each cascode amplifier circuit. In some embodiments, at least two of the cascode amplifier circuits may be connected to each other in an emitter-coupled differential amplifier configuration. In some embodiments, one or more (e.g., each) of the cascode amplifier circuits may include an fT-doubler circuit, for example, within a second stage of the cascode amplifier. In some embodiments, both stages of the cascode amplifier circuit may include an fT-doubler circuit. In some embodiments, fT-doubler circuits may be used at both the input stage of the ECL circuits (e.g., within a cascode amplifier) and an output stage (e.g., coupled to one or more output terminals of the ECL circuits). In some embodiments, the ECL circuits may be configured to perform one or more logic functions at a frequency up to or above 20 GHz (e.g., up to or greater than 50 GHz).

Figure 1:
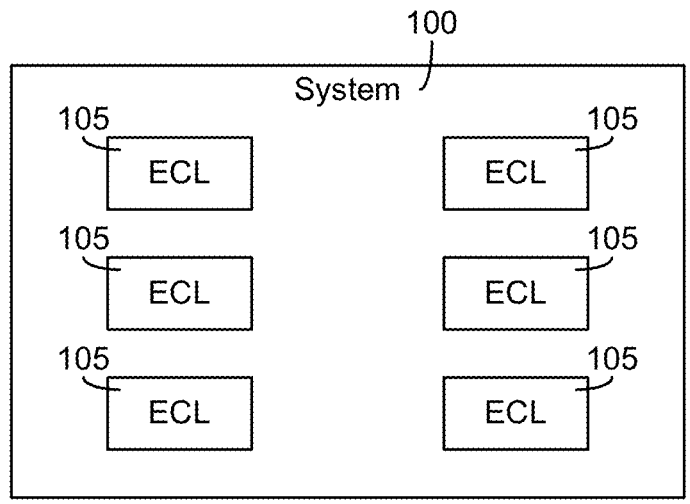
FIG. 1 is a block diagram of a system including a plurality of emitter-coupled logic circuits according to an exemplary embodiment.

Referring now to FIG. 1, a system 100 that includes one or more ECL circuits 105 is shown according to an exemplary embodiment. ECL circuits 105 may include any type of circuit having at least two transistors with their emitters coupled to one another. System 100 may be any type of system that utilizes logic circuits. For example, system 100 may be a synthesizer or a component of a synthesizer (e.g., a divider), a broadband system (e.g., with wide-ranging frequency requirements), a data linking system, a radar system, a communication system, or any other type of system that utilizes logic circuits. In some embodiments, system 100 may be a system configured to be included within an aircraft or a component of a military system (e.g., a communication system). In some embodiments, system 100 may include one or more transceivers (e.g., SiGe transceivers).

Some example systems may utilize high frequency logic cells to enhance system performance and capabilities. Some available logic cells have limited frequency capabilities, require a large amount of DC power, and have limited ability to integrate with different types of components. For example, Hittite high power, high speed logic cells have a maximum frequency capability of about 18 GHz, require much DC power, and are not easily integrated with SiGe BiCMOS transceivers.

ECL circuits 105 include one or more features configured to give ECL circuits 105 the ability to perform logic functions at a high frequency (e.g., greater than 20 GHz, such as up to or greater than 50 GHz). As described in greater detail below, in some embodiments, ECL circuits 105 may include one or both of fT-doubler circuits and/or cascode amplifiers to help increase the performance of ECL circuits 105. In some embodiments, ECL circuits 105 may be or include SiGe logic circuits. Some SiGe BiCMOS logic circuits may provide for higher levels of integration with native digital control and/or processing capabilities of system 100 and/or with RF on die capabilities of system 100 but may not be capable of performing high speed logic functions. ECL circuits 105 may include SiGe circuits with one or more features described in detail below that provide the benefits of SiGe circuits with improved high frequency capabilities.

Figure 2:
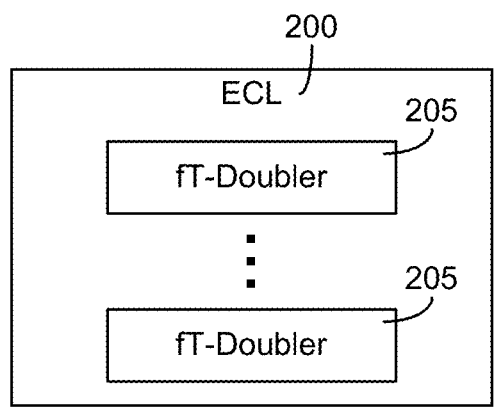
FIG. 2 is a block diagram of an emitter-coupled logic circuit according to an exemplary embodiment.

Referring now to FIG. 2, an example ECL 200 that may be used to provide improved performance (e.g., frequency) characteristics is shown according to an exemplary embodiment. ECL 200 includes one or more fT-doubler circuits 205 (e.g., within one or more amplifier circuits). Each fT-doubler circuit 205 includes two or more transistors coupled to one another to form a "super transistor." The transistors are coupled in an arrangement such that they behave as a single enhanced transistor with an increased unity current gain frequency, and hence increase the frequency capability of ECL 200 (e.g., an amplifier circuit within ECL 200) in which they are included (e.g., as compared to the frequency capability of ECL 200 if it used single transistors in place of fT-doubler circuits 205). The unity current gain frequency of a transistor in a common-emitter configuration is the operating frequency at which the transistor collector current equals the base current when operating into an RF short circuit (Ic=β*Ib for a bipolar transistor, but due to parasitics the effective β degrades with frequency until the transistor can no longer produce more collector current than the base current). When used in ECL 200, an fT-doubler circuit 205 can increase the frequency of operation of ECL 200 as compared to using single transistors by increasing the "super transistor" β, input impedance, and ft.

One example fT-doubler circuit 205 is illustrated in FIG. 3 according to an exemplary embodiment. The illustrated example fT-doubler circuit includes three transistors 305, 310, and 315 (e.g., BJT transistors) connected in an arrangement to form a type of "super transistor" configured to provide an increased unity current gain frequency. In the illustrated arrangement, the base terminals of transistors 310 and 315 and the collector terminal of transistor 310 are connected to the emitter terminal of transistor 305. The emitter terminals of transistors 310 and 315 are connected to one another and provide an emitter terminal for the fT-doubler circuit, and the collector terminals of transistors 305 and 315 are connected to one another and provide a collector terminal for the fT-doubler circuit. The base terminal of transistor 305 serves as the base terminal for the example fT-doubler circuit.

In some embodiments, ECL 200 illustrated in FIG. 2 may include a differential amplifier circuit. In some such embodiments, each leg of the differential amplifier circuit may include at least one fT-doubler circuit 205. In some embodiments, each leg may include multiple fT-doubler circuits 205. In some embodiments, ECL 200 may include an input stage connected to inputs of ECL 200 (e.g., one or more amplifier circuits) and an output stage connected to outputs of ECL 200, and one or both of the input stage and the output stage may include fT-doubler circuits 205 to increase the frequency capabitilites of ECL 200.

Referring now to FIG. 4, an example ECL 400 that may be used to provide increased performance characteristics is shown according to an exemplary embodiment. ECL 400 utilizes one or more cascode amplifier circuits 405. Cascode amplifier circuits 405 may be or include two-stage amplifier circuits with each stage including at least one transistor (e.g., with the emitter of one transistor coupled to the collector of another transistor). An emitter of at least one first transistor is coupled to a collector of at least one second transistor. The cascode configuration of the transistors limits the voltage gain from the collector to the base in the input stage transistor (because the collector is loaded by the emitter of the common base transistor, and the emitter is a low impedance), which reduces the Miller capacitance effect to the input, and increases frequency capability of the input transistors ability to produce current gain. The input transistors current gain is buffered through the common base stage [effectively since $Ic=\beta*Ib$, $Ie=Ic+Ib \rightarrow Ie=Ic(1+1/\beta)$, so for large $\beta$ this means $Ie \sim Ic$], where it then applies the current to the load and voltage gain is produced. The cascode arrangement extends the frequency at which high input impedance is maintained due to minimizing the Miller capacitance effect of the input transistor. In some embodiments, two or more cascode amplifier circuits 405 may be connected to one another in a differential amplifier configuration.

Referring now to FIG. 5, an example ECL 500 is shown that includes both cascode amplifier circuits and fT-doubler circuits. In the illustrated exemplary embodiment, ECL 500 includes one or more cascode amplifiers 505 that each include at least one fT-doubler circuit. In some embodiments, the use of fT-doubler circuits in combination with cascode arrangement of transistors may provide increased performance capabilities (e.g., higher operating frequency capabilities) as compared to ECLs that include only a cascode amplifier circuit or an fT-doubler circuit. In some embodiments, two or more of cascode amplifier circuits 505 may be connected to one another in a differential amplifier configuration.

In some embodiments, each cascode amplifier circuit 505 may include a single fT-doubler circuit within a single stage of the cascode amplifier circuit 505. In some embodiments, each stage of the cascode amplifier circuit 505 may include an fT-doubler circuit. For example, in some embodiments, a cascode amplifier circuit 505 may include a first fT-doubler circuit in a first stage having its emitter coupled to a collector of a second fT-doubler circuit in a second stage. In some embodiments, ECL 500 may include both an input stage (e.g., including cascode amplifier circuits 505) connected to inputs of ECL 500 and an output stage connected to outputs of ECL 500, and ECL 500 may include one or more fT-doubler circuits within one or both of the input stage and the output stage.

Figure 6:
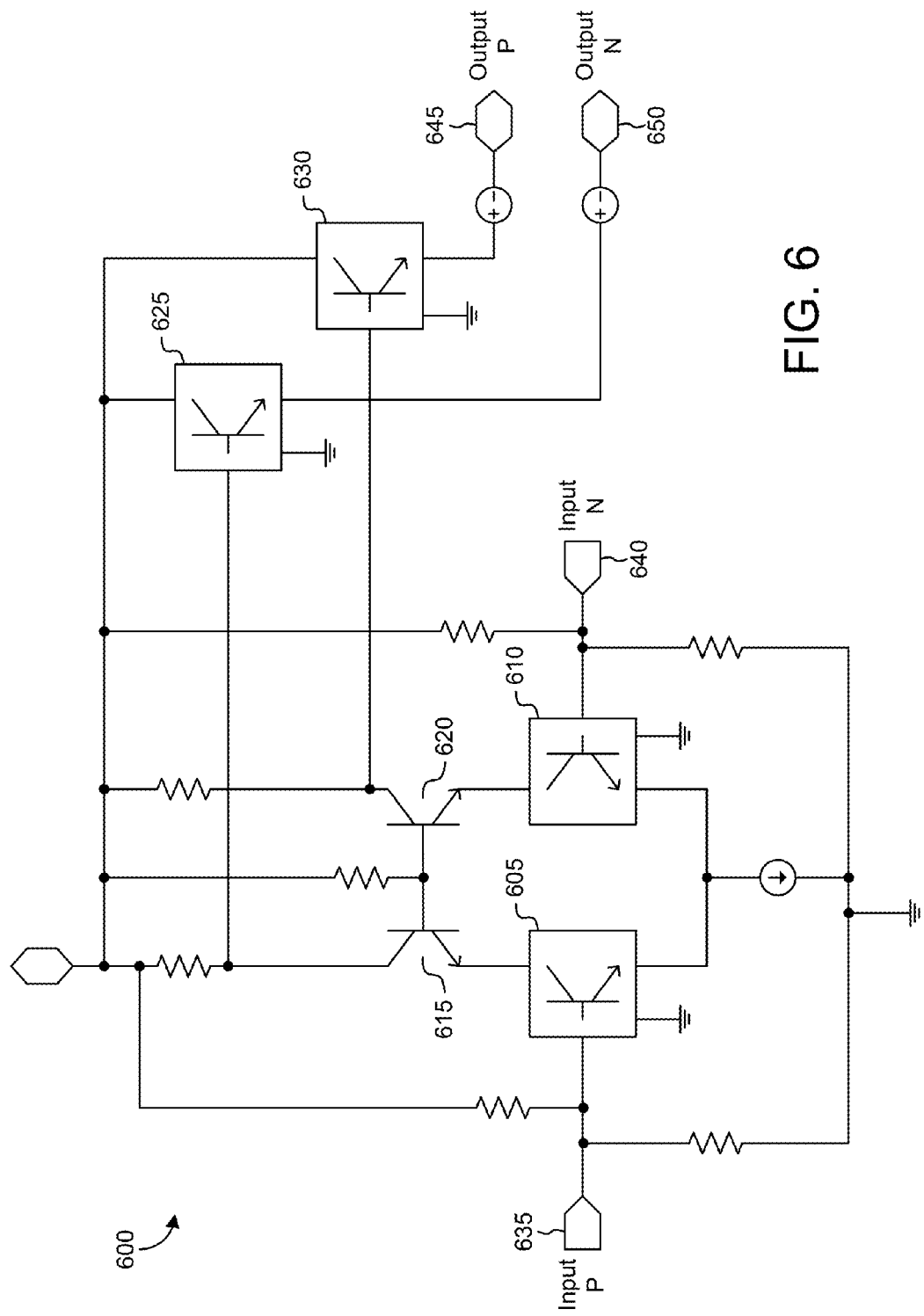
FIG. 6 is a circuit diagram of a buffer circuit according to an exemplary embodiment.

Referring now to FIG. 6, a buffer circuit 600 that utilizes both cascode amplifier circuits and fT-doubler circuits is shown according to an exemplary embodiment. Buffer circuit 600 may be configured to transmit received inputs to outputs of circuit 600 and may apply a gain and/or time delay to the inputs to produce the outputs. Two inputs 635 and 640 of buffer circuit 600 are connected to an input stage of circuit 600 that includes two cascode amplifier circuits. The cascode amplifier circuits include two stages. One stage of the first cascode amplifier circuit that is connected to input 635 includes a transistor 615, and another stage of the cascode amplifier circuit includes an fT-doubler circuit 605. One stage of the second cascode amplifier circuit that is connected to input 640 includes a transistor 620, and another stage of the cascode amplifier circuit includes another fT doubler circuit 610. The transistors used in circuit 600 and/or in other exemplary embodiments disclosed herein may include BJT transistors, FET transistors, and/or other types of transistors. The outputs of the collectors of transistors 615 and 620 are fed into an output stage of circuit 600. Specifically, the outputs are fed into two fT-doubler circuits 625 and 630, and the emitters of these circuits are connected to two outputs 650 and 645 of circuit 600. The use of fT-doubler circuits and/or cascode amplifier circuits may help allow buffer circuit 600 to operate at higher frequencies than conventional buffer circuits (e.g., over 20 GHz, such as up to or over 50 GHz).

Figures 7A, 7B:
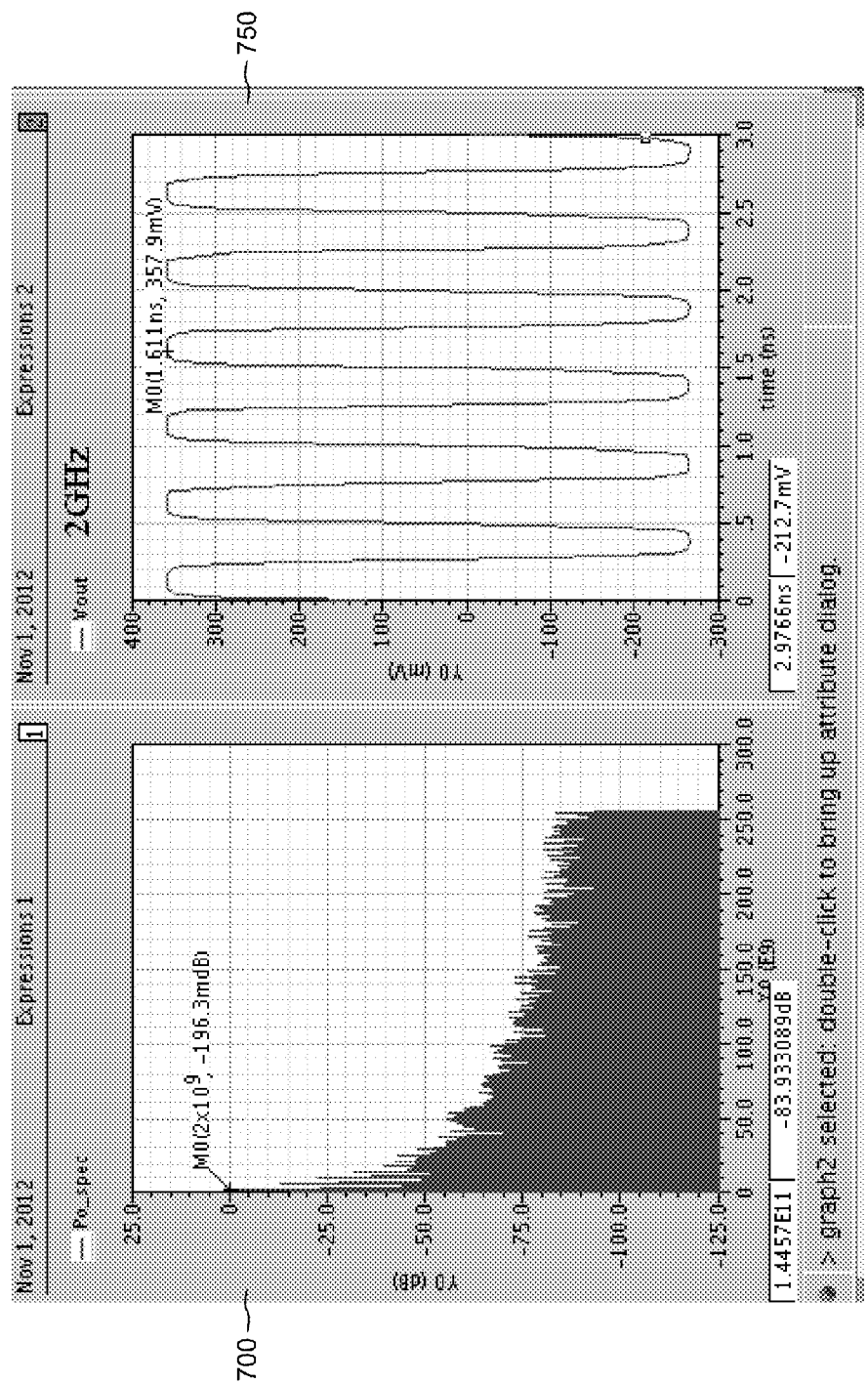
FIG. 7A is a simulated frequency response graph for the buffer circuit of FIG. 6 at a clock rate of 2 GHz according to an exemplary embodiment.
FIG. 7B is a simulated output voltage graph for the buffer circuit of FIG. 6 at a clock rate of 2 GHz according to an exemplary embodiment.

FIGS. 7A through 10B illustrate the simulated operation of buffer circuit 600 according to exemplary embodiments. FIG. 7A includes a simulated frequency response graph 700 for circuit 600 and FIG. 7B includes a simulated output voltage graph 750 for circuit 600 at a clock rate of 2 GHz. Graph 750 illustrates that circuit 600 effectively produces an output square wave at the 2 GHz clock rate. Graph 700 may be generated by applying a Fourier transform to the output waveform (e.g., as shown in graph 750). Graph 700 illustrates distinct peaks at the 2 GHz clock rate frequency as well as harmonics of the 2 GHz frequency (e.g., 4 GHz, 6 GHz, 8 GHz, etc.). Together, graphs 700 and 750 illustrate that buffer circuit 600 operates effectively at an operational frequency of 2 GHz.

Figures 8A, 8B:
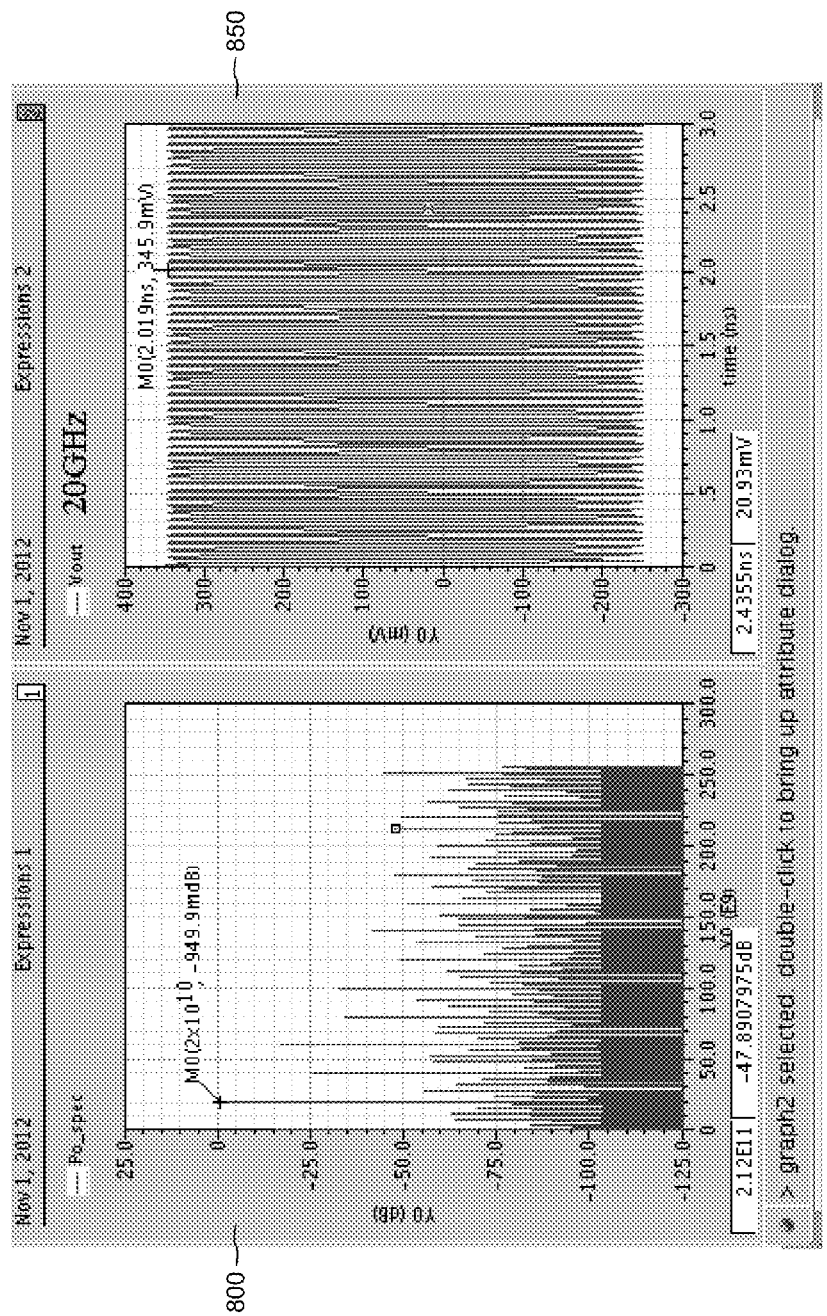
FIG. 8A is a simulated frequency response graph for the buffer circuit of FIG. 6 at a clock rate of 20 GHz according to an exemplary embodiment.
FIG. 8B is a simulated output voltage graph for the buffer circuit of FIG. 6 at a clock rate of 20 GHz according to an exemplary embodiment.
Figures 9A, 9B:
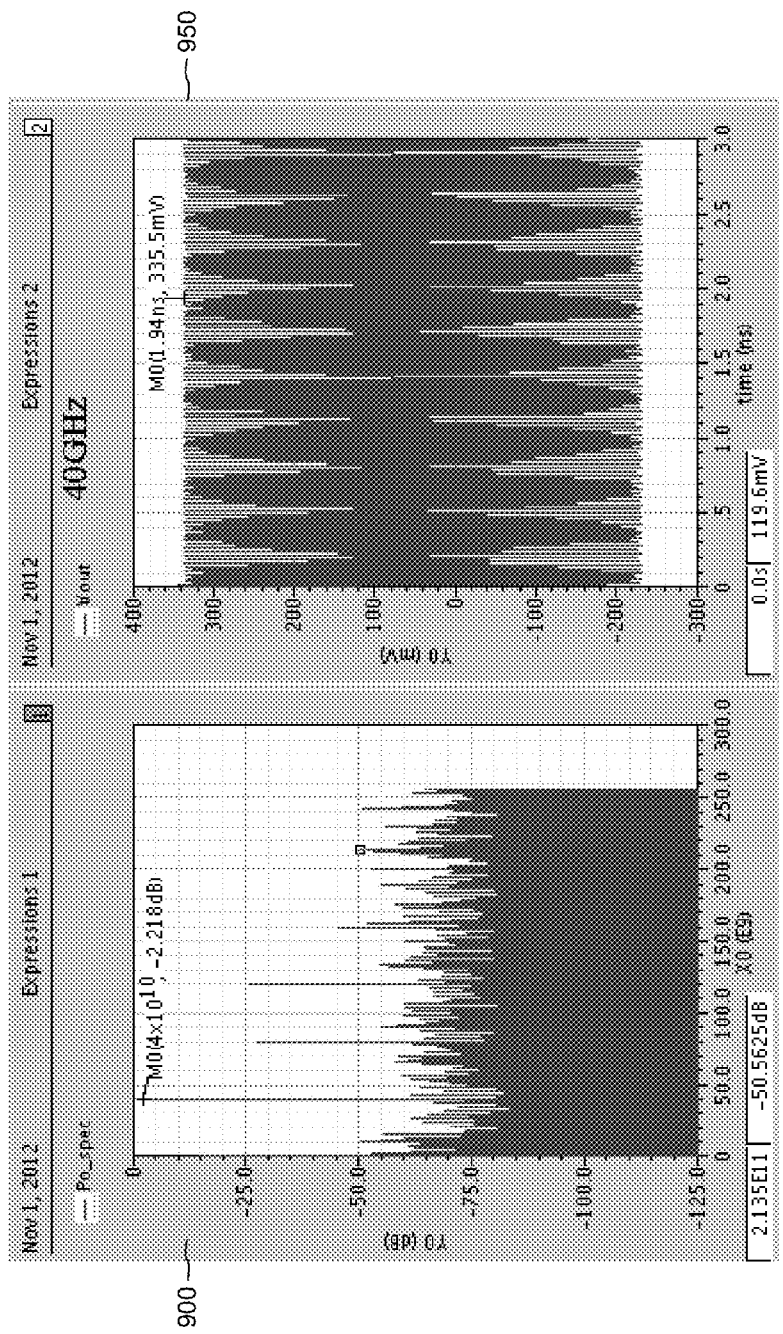
FIG. 9A is a simulated frequency response graph for the buffer circuit of FIG. 6 at a clock rate of 40 GHz according to an exemplary embodiment.
FIG. 9B is a simulated output voltage graph for the buffer circuit of FIG. 6 at a clock rate of 40 GHz according to an exemplary embodiment.
Figures 10A, 10B:
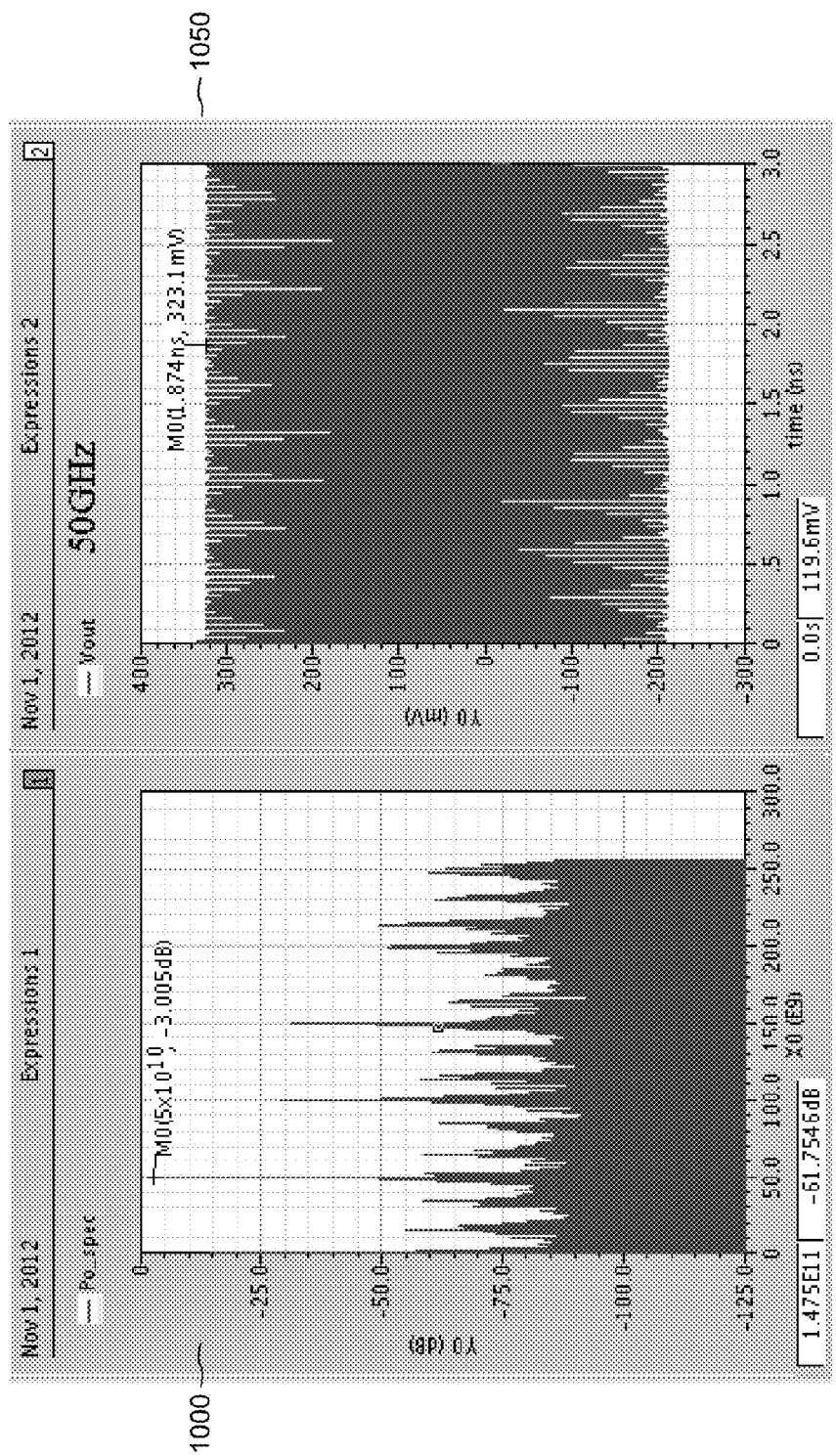
FIG. 10A is a simulated frequency response graph for the buffer circuit of FIG. 6 at a clock rate of 50 GHz according to an exemplary embodiment.
FIG. 10B is a simulated output voltage graph for the buffer circuit of FIG. 6 at a clock rate of 50 GHz according to an exemplary embodiment.

The graphs shown in FIGS. 8A through 10B illustrate that circuit 600 also operates effectively at frequencies well above the 2 GHz frequency associated with FIGS. 7A and 7B. FIGS. 8A and 8B include a simulated frequency response graph 800 and output voltage graph 850 for circuit 600 at a clock rate of 20 GHz. Graph 850 shows an effectively constructed 20 GHz output waveform, and graph 800 illustrates peaks at 20 GHz and harmonics of 20 GHz. FIGS. 9A and 9B include a simulated frequency response graph 900 and output voltage graph 950 for circuit 600 at a clock rate of 40 GHz. Graph 950 shows an effectively constructed 40 GHz output waveform, and graph 900 illustrates peaks at 40 GHz and harmonics of 40 GHz. FIGS. 10A and 10B include a simulated frequency response graph 1000 and output voltage graph 1050 for circuit 600 at a clock rate of 50 GHz. Graph 1050 shows an effectively constructed 50 GHz output waveform, and graph 1000 illustrates peaks at 50 GHz and harmonics of 50 GHz. Together, graphs 800, 850, 900, 950, 1000, and 1050 illustrate that circuit 600 can effectively operate at frequencies up to 50 GHz. In some embodiments, circuit 600 may be capable of achieving operating frequencies in excess of 50 GHz.

Figure 11:
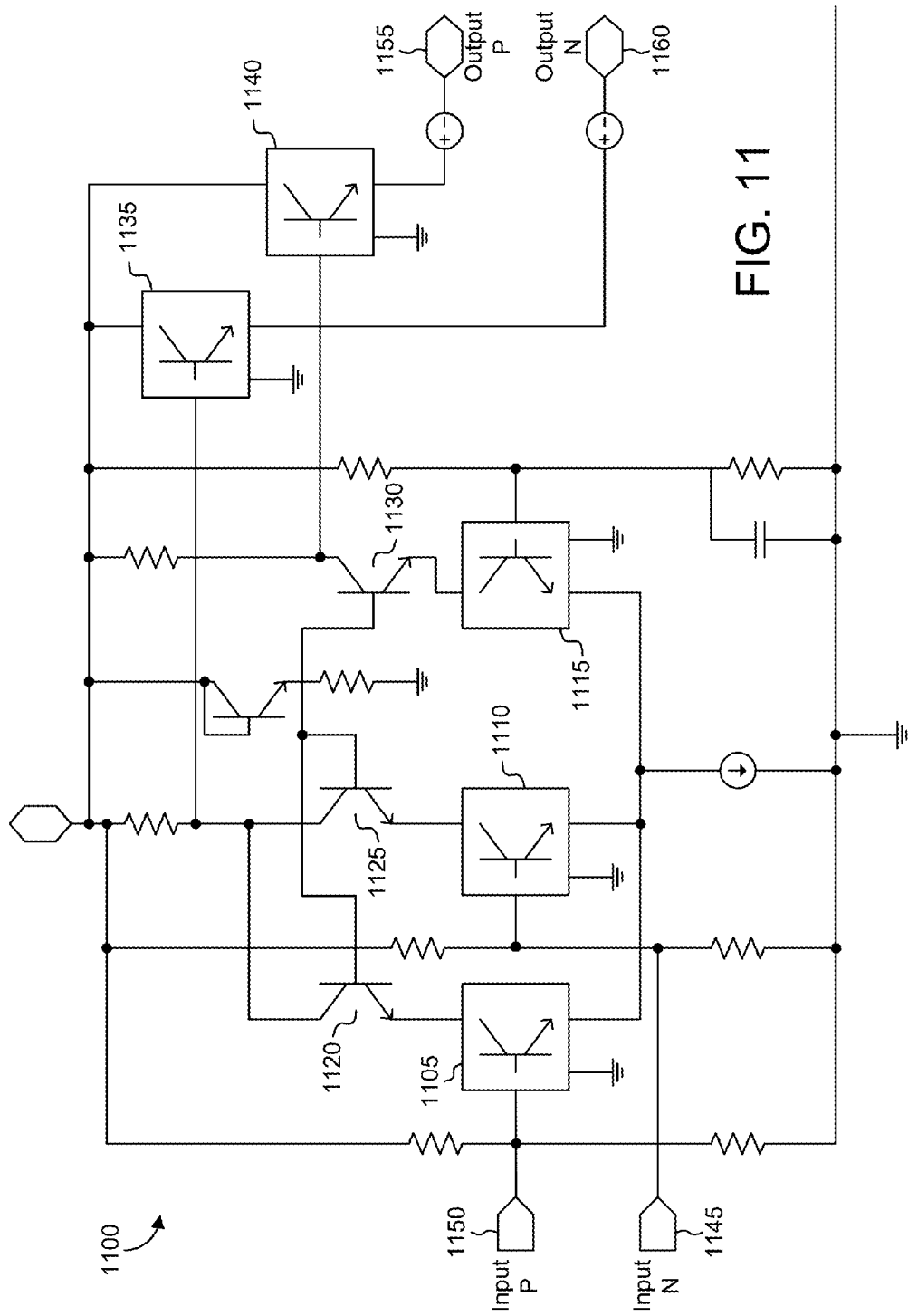
FIG. 11 is a circuit diagram of an OR/NOR circuit according to an exemplary embodiment.

Referring now to FIG. 11, an example OR/NOR circuit 1100 that utilizes both cascode amplifier circuits and fT-doubler circuits is shown according to an exemplary embodiment. When utilized as an OR circuit, an output value provided via outputs 1155 and 1160 will be false (e.g., zero) when neither of two inputs 1145 and 1150 is true (e.g., one), and the output value will be true (e.g., one) otherwise. When utilized as a NOR circuit, the output value will be exactly the opposite, i.e., true when neither of inputs 1145 and 1150 is true and false otherwise.

Circuit 1100 includes an input stage connected to two inputs 1145 and 1150 of circuit 1100. The input stage includes three cascode amplifier circuits. The first cascode amplifier circuit includes transistor 1120 and fT-doubler circuit 1105, the second cascode amplifier circuit includes transistor 1125 and fT-doubler circuit 1110, and the third cascode amplifier circuit includes transistor 1130 and fT-doubler circuit 1115. The emitters of fT-doubler circuits 1105, 1110, and 1115 are coupled to one another. The collectors of transistors 1120, 1125, and 1130 are coupled to an output stage of OR/NOR circuit 1100. Specifically, the collectors of transistors 1120 and 1125 are coupled to an fT-doubler circuit 1135, and a collector of transistor 1130 is coupled to an fT-doubler circuit 1140. fT-doubler circuits 1135 and 1140 are coupled to outputs 1160 and 1155, respectively, of circuit 1100. Like buffer circuit 600, the use of cascode amplifier circuits and/or fT-doubler circuits may help OR/NOR circuit 1100 operate up to a higher operating frequency than a traditional OR/NOR logic circuit.

Figures 12A, 12B:
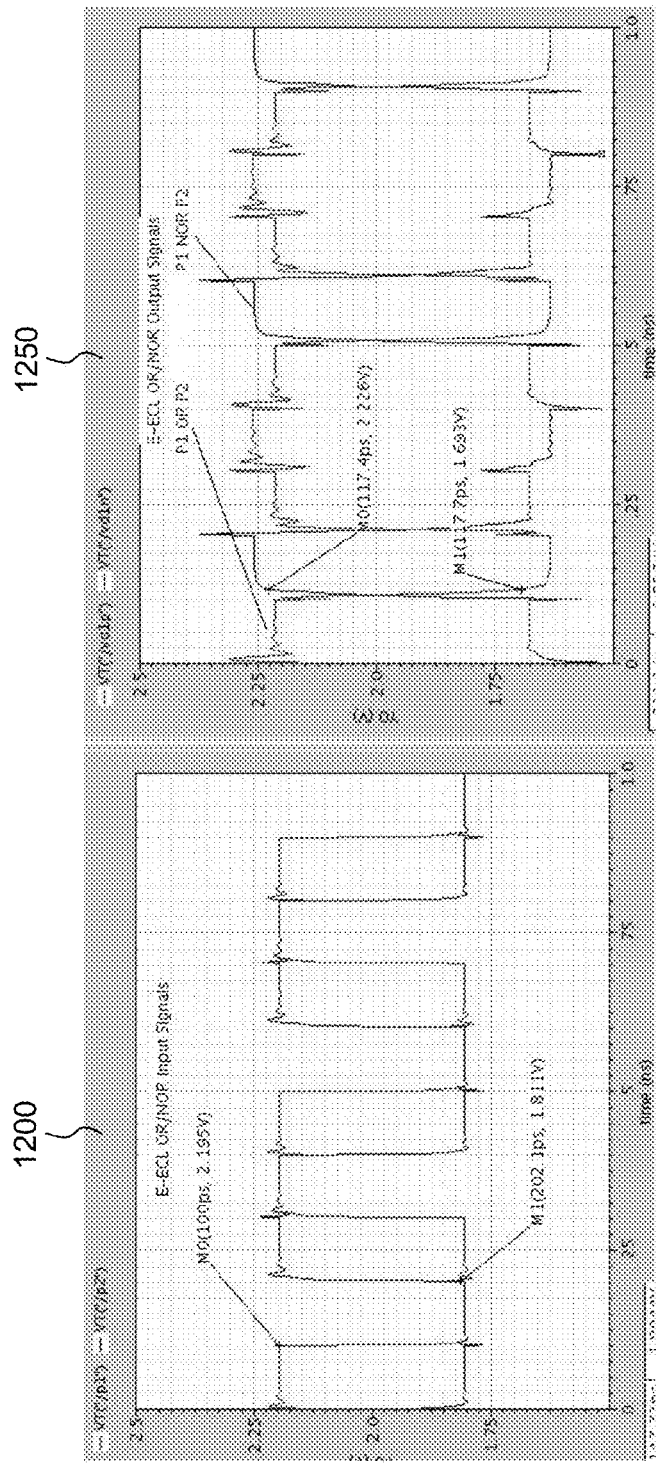
FIG. 12A is a simulated input voltage graph for the OR/NOR circuit of FIG. 11 at a switching rate of 10 GHz according to an exemplary embodiment.
FIG. 12B is a simulated output voltage graph resulting from the input signal shown in FIG. 12A for the OR/NOR circuit of FIG. 11 at a switching rate of 10 GHz according to an exemplary embodiment.

FIGS. 12A through 14B illustrate simulated operation of OR/NOR circuit 1100 at different operating frequencies according to exemplary embodiments. FIG. 12A includes a simulated input voltage graph 1200 and FIG. 12B includes a simulated output voltage graph 1250 for circuit 1100 at a switching rate of 10 GHz. Graph 1250 illustrates that, for the 10 GHz switching input signal shown in graph 1200, OR and NOR signals are effectively generated by circuit 1100 as shown within graph 1250. Additionally, graph 1250 illustrates that state transitions occur quickly. For example, the point labeled M0 is a transition in one of the input signals from high to low, such that after the transition both inputs are low. This causes a transition in the NOR signal to a high state. Point M0 in graph 1250 shows that the transition occurs in approximately 17 picoseconds (i.e., the difference between the transition point M0 labeled in graph 1200 at 100 ps and the entry of the NOR high state labeled as M0 in graph 1250).

Figures 13A, 13B:
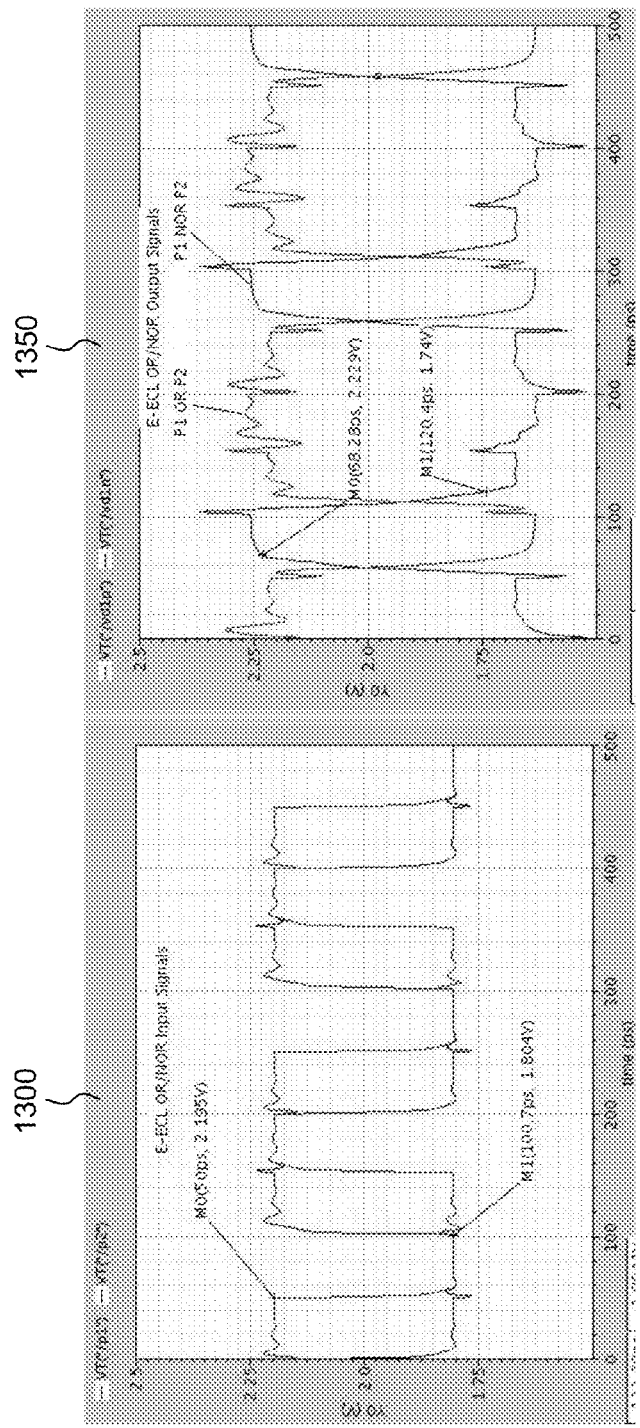
FIG. 13A is a simulated input voltage graph for the OR/NOR circuit of FIG. 11 at a switching rate of 20 GHz according to an exemplary embodiment.
FIG. 13B is a simulated output voltage graph resulting from the input signal shown in FIG. 13A for the OR/NOR circuit of FIG. 11 at a switching rate of 20 GHz according to an exemplary embodiment.
Figures 14A, 14B:
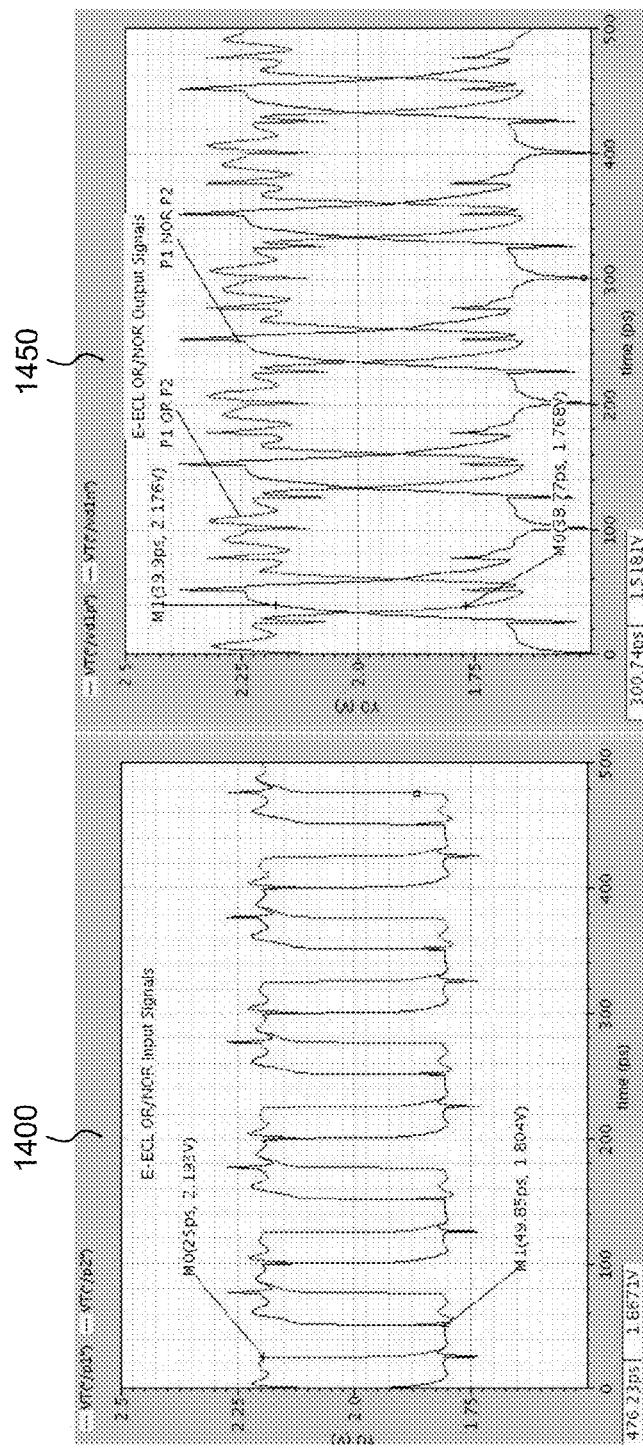
FIG. 14A is a simulated input voltage graph for the OR/NOR circuit of FIG. 11 at a switching rate of 40 GHz according to an exemplary embodiment.
FIG. 14B is a simulated output voltage graph resulting from the input signal shown in FIG. 14A for the OR/NOR circuit of FIG. 11 at a switching rate of 40 GHz according to an exemplary embodiment.

FIGS. 13A and 13B show graphs 1300 and 1350 that are analogous to graphs 1200 and 1250 but for a switching rate of 20 GHz. FIGS. 14A and 14B show graphs 1400 and 1450 that are analogous to graphs 1200 and 1250 for a switching rate of 40 GHz. Graphs 1350 and 1450 illustrate that OR and NOR signals are effectively generated by circuit 1100 for frequencies up to 40 GHz. In some embodiments, circuit 1100 may be capable of operating at frequencies above 40 GHz, such as up to or above 50 GHz.

Figure 15:
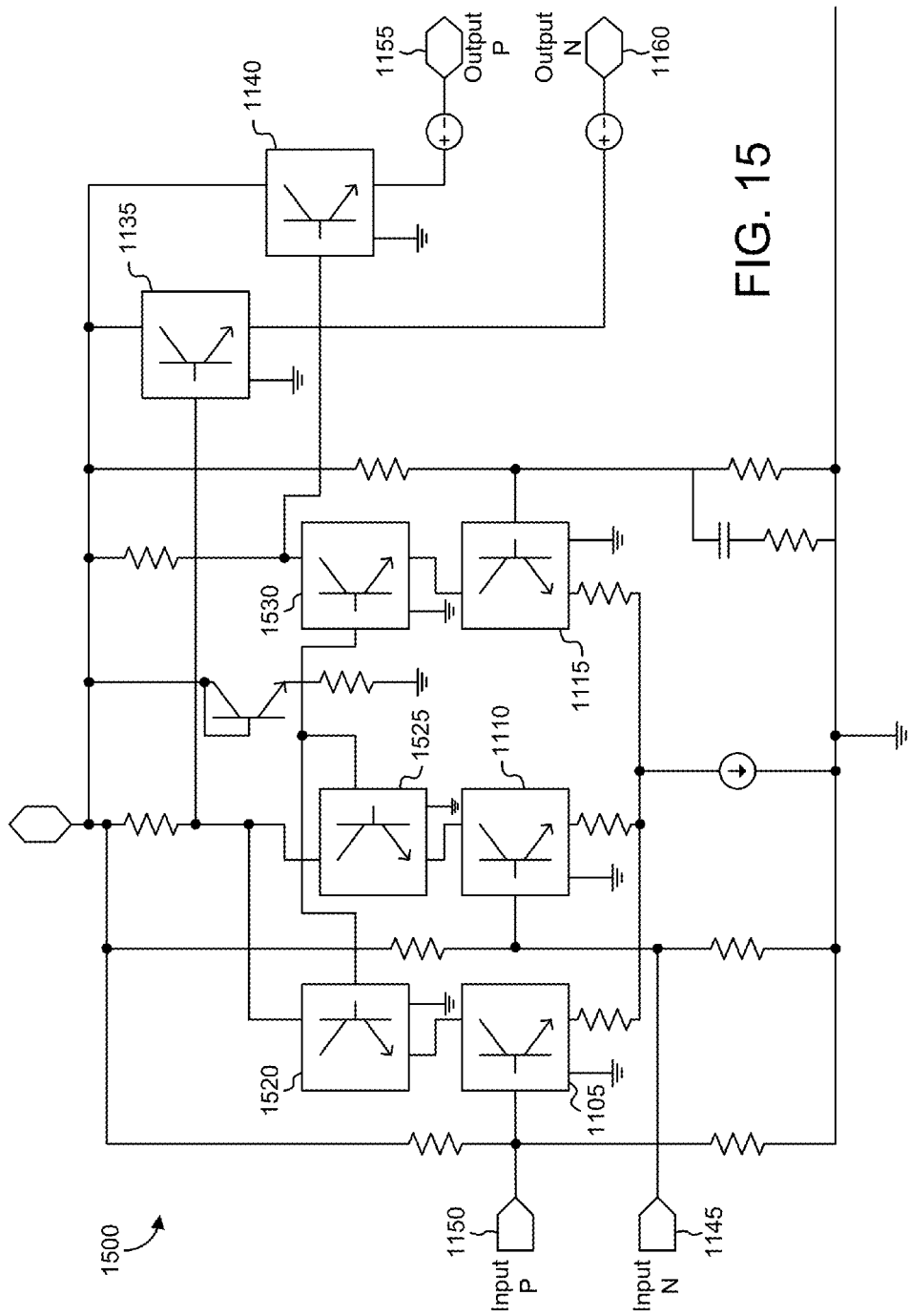
FIG. 15 is a circuit diagram of an OR/NOR circuit according to another exemplary embodiment.

FIG. 15 illustrates another example OR/NOR circuit 1500 according to another exemplary embodiment. Circuit 1500 includes many of the same components as circuit 1100. In circuit 1500, the transistors 1120, 1125, and 1130 of circuit 1100 have been replaced with fT-doubler circuits 1520, 1525, and 1530, respectively. Accordingly, in circuit 1500, each cascode amplifier circuit includes an fT-doubler circuit at both stages of the cascode amplifier circuit. In some embodiments, the additional fT-doubler circuits may further improve the performance (e.g., frequency) capabilities of circuit 1500 as compared to circuit 1100.

The disclosure is described above with reference to drawings. These drawings illustrate certain details of specific embodiments that implement the systems and methods and programs of the present disclosure. However, describing the disclosure with drawings should not be construed as imposing on the disclosure any limitations that may be present in the drawings. Some embodiments of the present disclosure may be implemented using an existing computer processor, or by a special purpose computer processor incorporated for this or another purpose or by a hardwired system. No claim element herein is to be construed under the provisions of 35 U.S.C. §112, sixth paragraph, unless the element is expressly recited using the phrase "means for." Furthermore, no element, component or method step in the present disclosure is intended to be dedicated to the public, regardless of whether the element, component or method step is explicitly recited in the claims.

It should be noted that although the flowcharts provided herein show a specific order of method steps, it is understood that the order of these steps may differ from what is depicted. Also two or more steps may be performed concurrently or with partial concurrence. Such variation will depend on the software and hardware systems chosen and on designer choice.

The foregoing description of embodiments of the disclosure have been presented for purposes of illustration and description. It is not intended to be exhaustive or to limit the disclosure to the precise form disclosed, and modifications and variations are possible in light of the above teachings or may be acquired from practice of the disclosure. The embodiments were chosen and described in order to explain the principals of the disclosure and its practical application to enable one skilled in the art to utilize the disclosure in various embodiments and with various modifications as are suited to the particular use contemplated.

What is claimed is:

1. An emitter-coupled logic circuit comprising:
   a plurality of fT-doubler circuits, wherein each fT-doubler circuit comprises a plurality of transistors coupled to one another in an arrangement such that the plurality of transistors are configured to behave as a single enhanced transistor that has an effective unity current gain frequency that is higher than if a single transistor were used in its place, wherein the plurality of fT-doubler circuits are configured to increase an operating frequency capability of the emitter-coupled logic circuit as compared to using single transistors in place of the fT-doubler circuits.

2. The emitter-coupled logic circuit of claim 1, further comprising a differential amplifier circuit, wherein the differential amplifier circuit comprises at least two fT-doubler circuits.

3. The emitter-coupled logic circuit of claim 1, wherein the emitter-coupled logic circuit comprises one of a buffer circuit, an AND gate, an OR gate, a NOT gate, a NAND gate, a NOR gate, an XOR gate, or an XNOR gate.

4. The emitter-coupled logic circuit of claim 1, further comprising a cascode amplifier circuit, wherein the cascode amplifier circuit comprises at least one of the plurality of fT-doubler circuits.

5. The emitter-coupled logic circuit of claim 4, wherein the cascode amplifier circuit comprises two or more of the plurality of fT-doubler circuits.

6. The emitter-coupled logic circuit of claim 4, wherein the cascode amplifier circuit is a first cascode amplifier circuit, wherein the emitter-coupled logic circuit further comprises a second cascode amplifier circuit, wherein the first and second cascode amplifier circuits are connected in a differential amplifier configuration, and wherein each of the first and second cascode amplifier circuits comprises at least one of the plurality of fT-doubler circuits.

7. The emitter-coupled logic circuit of claim 1, wherein the emitter-coupled logic circuit is configured to perform one or more logic functions at frequencies up to and beyond 20 GHz.

8. The emitter-coupled logic circuit of claim 1, wherein the emitter-coupled logic circuit comprises an input stage connected to one or more inputs of the emitter-coupled logic circuit and an output stage connected to one or more outputs of the emitter-coupled logic circuit, and wherein the input stage and the output stage both comprise at least one of the plurality of fT-doubler circuits.

9. An emitter-coupled logic circuit comprising:
   a plurality of cascode amplifier circuits, wherein each cascode amplifier circuit comprises a plurality of transistors, wherein an emitter of at least one first transistor of the plurality of transistors is coupled to a collector of at least one second transistor of the plurality of transistors.

10. The emitter-coupled logic circuit of claim 9, wherein each of the plurality of cascode amplifier circuits comprises at least one fT-doubler circuit, wherein each fT-doubler circuit comprises a plurality of transistors coupled to one another in an arrangement such that the plurality of transistors are configured to behave as a single enhanced transistor that has an effective unity current gain frequency that is higher than if a single transistor were used in its place, wherein the fT-doubler circuits are configured to increase an operating frequency capability of the emitter-coupled logic circuit as compared to using single transistors in place of the fT-doubler circuits.

11. The emitter-coupled logic circuit of claim 10, wherein each cascode amplifier circuit comprises a plurality of fT-doubler circuits.

12. The emitter-coupled logic circuit of claim 10, wherein the emitter-coupled logic circuit comprises an input stage connected to one or more inputs of the emitter-coupled logic circuit and an output stage connected to one or more outputs of the emitter-coupled logic circuit, and wherein the input stage and the output stage both comprise at least one fT-doubler circuit.

13. The emitter-coupled logic circuit of claim 9, wherein the emitter-coupled logic circuit comprises one of a buffer circuit, an AND gate, an OR gate, a NOT gate, a NAND gate, a NOR gate, an XOR gate, or an XNOR gate.

14. The emitter-coupled logic circuit of claim 9, wherein the emitter-coupled logic circuit is configured to perform one or more logic functions at frequencies up to and beyond 20 GHz.

15. A system comprising:
a plurality of emitter-coupled logic circuits, wherein each emitter-coupled logic circuit comprises a plurality of cascode amplifier circuits, wherein each cascode amplifier circuit comprises a plurality of transistors, wherein an emitter of at least one first transistor of the plurality of transistors is coupled to a collector of at least one second transistor of the plurality of transistors, and
wherein each of the plurality of cascode amplifier circuits comprises at least one fT-doubler circuit, wherein each fT-doubler circuit comprises a plurality of transistors coupled to one another in an arrangement such that the plurality of transistors are configured to behave as a single enhanced transistor that has an effective unity current gain frequency that is higher than if a single transistor were used in its place, wherein the fT-doubler circuits are configured to increase an operating frequency capability of the emitter-coupled logic circuit as compared to using single transistors in place of the fT-doubler circuits.

16. The system of claim 15, wherein one or more of the plurality of emitter-coupled logic circuits comprises a plurality of fT-doubler circuits.

17. The system of claim 15, wherein the plurality of emitter-coupled logic circuits comprise one or more of a buffer circuit, an AND gate, an OR gate, a NOT gate, a NAND gate, a NOR gate, an XOR gate, or an XNOR gate.

18. The system of claim 15, wherein each of the emitter-coupled logic circuits is configured to perform one or more logic functions at frequencies up to and beyond 20 GHz.

19. The system of claim 15, wherein one or more of the emitter-coupled logic circuits comprises an input stage connected to one or more inputs of the emitter-coupled logic circuit and an output stage connected to one or more outputs of the emitter-coupled logic circuit, and wherein the input stage and the output stage both comprise at least one fT-doubler circuit.

20. The system of claim 15, wherein the system comprises an SiGe transceiver.

* * * * *